(12) United States Patent
Venditti

(10) Patent No.: US 8,779,819 B1
(45) Date of Patent: Jul. 15, 2014

(54) TRANSMITTER OUTPUT IMPEDANCE CALIBRATION FOR OUTPUT RISE AND FALL TIME EQUALIZATION AND EDGE RATE CONTROL

(71) Applicant: PMC-Sierra US, Inc., Sunnyvale, CA (US)

(72) Inventor: Michael Ben Venditti, Montreal (CA)

(73) Assignee: PMC-Sierra US, Inc., Sunnyvale, CA (US)

( * ) Notice: Subject to any disclaimer, the term of this patent is extended or adjusted under 35 U.S.C. 154(b) by 0 days.

(21) Appl. No.: 13/873,639

(22) Filed: Apr. 30, 2013

Related U.S. Application Data

(60) Provisional application No. 61/640,339, filed on Apr. 30, 2012.

(51) Int. Cl.
*H03K 5/12* (2006.01)
(52) U.S. Cl.
USPC .......................................................... 327/170
(58) Field of Classification Search
CPC .............. H03K 19/00361; H03K 5/12; H03K 19/00384
USPC .......................................................... 327/170
See application file for complete search history.

(56) References Cited

U.S. PATENT DOCUMENTS

| | | | |
|---|---|---|---|
| 7,135,884 B1 | 11/2006 | Talbot et al. | |
| 7,501,851 B2 * | 3/2009 | Venditti et al. | 326/30 |
| 7,746,096 B1 | 6/2010 | Yang | |
| 7,888,962 B1 | 2/2011 | Om | |
| 8,427,220 B2 * | 4/2013 | Suzuki et al. | 327/309 |
| 8,446,173 B1 * | 5/2013 | Faucher et al. | 326/86 |
| 8,547,140 B1 * | 10/2013 | Faucher et al. | 326/83 |
| 8,624,641 B1 * | 1/2014 | Faucher et al. | 327/112 |
| 2004/0090255 A1 * | 5/2004 | Ajit | 327/170 |
| 2007/0285120 A1 * | 12/2007 | Venditti et al. | 326/30 |
| 2011/0169547 A1 * | 7/2011 | Suzuki et al. | 327/384 |
| 2013/0099849 A1 * | 4/2013 | Suzuki et al. | 327/384 |

* cited by examiner

*Primary Examiner* — Adam Houston
(74) *Attorney, Agent, or Firm* — Dennis R. Haszko

(57) ABSTRACT

A method and apparatus to independently adjust the output rise and fall time of a transmitter for the purposes of improving high-speed signaling characteristics and reducing electromagnetic interference (EMI). Also described is an apparatus to provide a high-speed edge-rate control feature. The disclosed method and apparatus for rise and fall time equalization has a closed-loop calibration system that includes an actuation apparatus within the transmitter driver, a sensing means at the output of the transmitter to measure the degree of rise/fall time imbalance, and a calibration state machine operating on the sensor output to devise correction control inputs to the actuator in the transmitter driver to correct the rise/fall time imbalance. Also described is how the actuation apparatus within the transmitter driver can further be used to provide an open-loop edge-rate control feature for the transmitter.

16 Claims, 18 Drawing Sheets

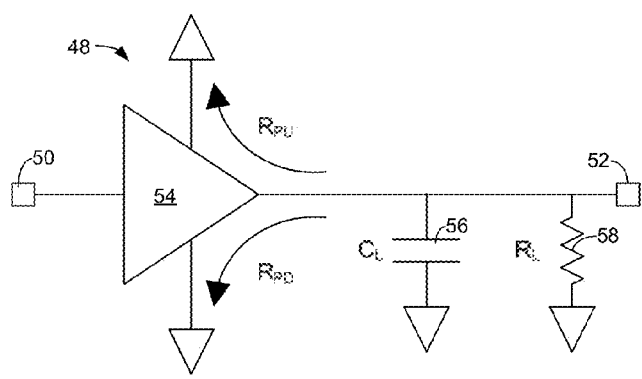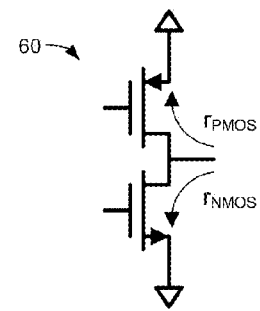
FIG. 2A
Prior Art
FIG. 2B
Prior Art

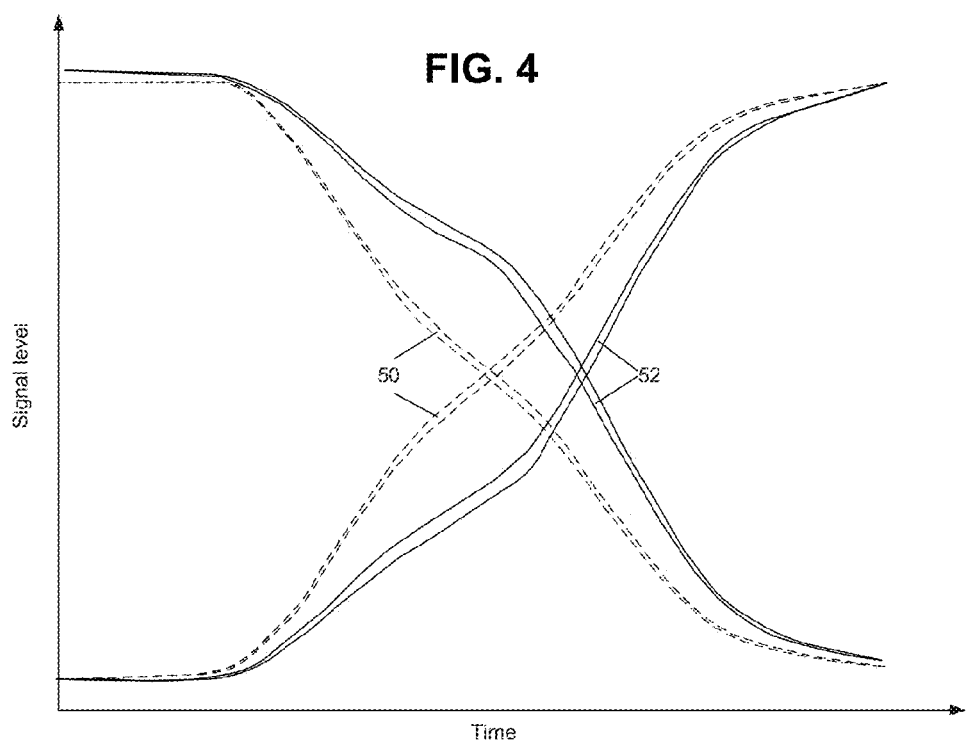

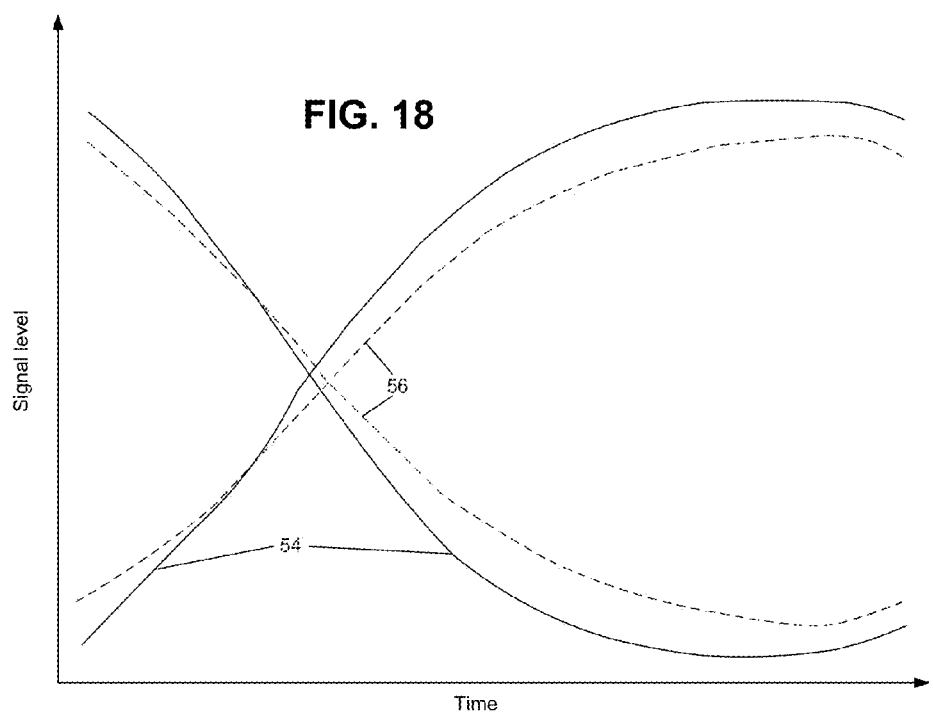

TRANSMITTER OUTPUT IMPEDANCE CALIBRATION FOR OUTPUT RISE AND FALL TIME EQUALIZATION AND EDGE RATE CONTROL

CROSS REFERENCE TO RELATED APPLICATIONS

This application claims the benefit of priority of U.S. Provisional Patent Application No. 61/640,339, filed Apr. 30, 2012, which is incorporated herein by reference in its entirety.

FIELD

The present disclosure relates generally to transmitters. A particular field of technology relates to differential high-speed transmitters (several or tens of Gb/s) used in transmission lines and/or backplane environments (e.g. SAS, SATA, PCI Express, Ethernet 10G Base-KR, E/GPON, etc.) Other fields of technology include double data rate (DDR) interfaces.

BACKGROUND

Mismatched output rise and fall times lead to asymmetric characteristics on the single-ended signals of a differential transmitter. This in turn results in a non-static common mode signal during bit transition events. This is illustrated in FIG. 1, where the solid traces 20 and 22 represent the single-ended components of the differential transmitter output with asymmetric rise and fall time, and the dashed trace 24 represents the impact of the asymmetric rise and fall time in the form of spikes on the common mode signal.

In certain transmitter applications it can be desirable to provide an edge-rate control feature. This can prove useful as a means to ensure that, under particularly fast process, voltage, and temperature operating conditions, output transition times can be slowed down to fall in the acceptable range called for by the applicable specification.

Edge rate control can also prove useful when a transmitter design targets a specific generation of a specification but also provides support for one or more legacy generations of the same specification (for example, targeting support for 12 Gb/s SAS but providing legacy support for prior generations operating at 6 Gb/s, 3 Gb/s or 1.5 Gb/s) which may have disparate and possibly incompatible maximum and minimum limits for output rise and fall times. In such cases, the edge rate control feature is typically activated when the transmitter is configured to support one of the legacy specification generations. Edge rate control may or may not be employed for the target specification generation, depending on its requirements.

Transition times for a transmitter are highly dependent on the effective resistance (load resistance) and capacitance (load capacitance) present at the transmitter output, which define RC time constants. FIG. 2A shows a diagram of transmitter 48 that has an input 50, an output 52, a driver 54 (which can also be referred to as an output driver), a capacitor 56, which has a load capacitance value $C_L$, and a resistor 58, which has a load resistance value $R_L$. FIG. 2B shows an inverter element 60, which is part of the driver 54. The resistive portion of the RC time constant of the transmitter 48 is dependent on the external load ($R_L$), the capacitance ($C_L$) at the transmitter output, parasitic elements, and the signal path inside the transmitter. The resistive paths of the transmitter are usually nominally designed to be the same during either a rising ($R_{PU}$: pull-up resistance) or falling ($R_{PD}$: pull-down resistance) transition. However, over silicon process variation, operating voltage and temperature, and random mismatch effects, $R_{PU}$ and $R_{PD}$ will vary in an absolute sense and with respect to each other. The rise time ($t_{rise}$) and fall time can be defined accordingly with dependency on $R_{PU}$ and $R_{PD}$, as per Equation 1.

$$t_{rise} \propto (R_{PU} \| R_L) C_L$$
$$t_{fall} \propto (R_{PD} \| R_L) C_L$$

Equation 1

FIG. 3A shows a voltage mode transmitter 62, elements of which are described in U.S. Pat. No. 7,501,851, granted Mar. 10, 2009. The voltage mode transmitter 62 has a driver structure that includes multiple unit cells 64, each with CMOS drivers 54 driving series resistances. The multiple unit cells 64 are connected in parallel and produce the outputs 66 and 68 as a function of the inputs 70 and 72, which are common to each unit cell 64. Each CMOS driver 54 includes an inverter element 60 shown at FIG. 3B. Each inverter element 60 has a PMOS device 74 and an NMOS device 76. For the voltage mode transmitter 62, the difference between $R_{PU}$ and $R_{PD}$ will be dictated by the matching of the on-resistance of the PMOS ($r_{PMOS}$) and NMOS ($r_{NMOS}$) devices 74 and 76 that make up the inverter element 60. For the drivers 54 illustrated in FIG. 3A, $R_{PU}$ and $R_{PD}$ can be expressed as per Equation 2, where the series resistance $R_{SER}$ 78 is a common resistor component, and $r_{PMOS}$ and $r_{NMOS}$ are distinct components for $R_{PU}$ and $R_{PD}$, respectively.

$$R_{PU} = R_{SER} + r_{PMOS}$$
$$R_{PD} = R_{SER} + r_{NMOS}$$

Equation 2

Thus, an important source of rise and fall time mismatch in a voltage mode transmitter originates from mismatches in the on-resistance of the PMOS ($r_{PMOS}$) and NMOS ($r_{NMOS}$) devices 74 and 76 shown at FIG. 3B. $R_{SER}$ is a series resistance that can be attributable, for example, to a polysilicon resistor in some embodiments or to highly doped metals in other embodiments.

Also shown in FIG. 3A are a driver enable port 80 and a parallel termination enable port 82. The parallel transmission gate enable port 82 is connected to transmission gates 79. Such transmission gates 79 are sometimes used as a means to achieve amplitude control in a configurable voltage mode transmitter such as the voltage mode transmitter 62 of FIG. 3A. The transmission gates 79 do not form part of the pull-up or pull-down path resistances in the unit driver cells, but they do serve to establish the output impedance of the transmitter 62 when they are enabled. A unit drive cell would either be configured to operate in drive mode (DEN=1) or in parallel termination mode (PTEN=1). In parallel termination mode, the CMOS inverter-like drivers are disabled and the transmission gate is enabled. This establishes a shunt resistive path between the transmitter outputs TXOP and TXON, comprised of two $R_{SER}$ contributions and the effective resistance of the transmission gate. The transmission gate is built as a parallel connection of PMOS and NMOS devices.

A traditional form of edge rate control is achieved by blending between the normal data to be transmitted by the transmitter and a version of the data delayed by non-sequential circuit elements. A portion of the transmitter driver is configured to output the normal data, and another portion is configured to output the delayed data. Blending is achieved at the transmitter output node and controlled by adjusting the relative portion of the transmitter that outputs normal data to the portion that outputs delayed data.

Such a blending approach has advantages, for example, simplicity, but also has numerous disadvantages. This blending approach is good at slowing down output transition times when the amount of delay between the normal and delayed data paths is smaller than the transition times of the signals on the normal and delayed data paths. However, when the delay exceeds the transition times, then there is little or no effective blending anymore, resulting in "kinked" waveforms, as illustrated by the eye diagrams shown in FIG. 4, where a first waveform with an initial amount of time delay between the normal data path and a delayed data path is shown at reference numeral 50, and a second waveform with an increased amount of time delay between the normal data path and the delayed data path is shown at reference numeral 52.

The relative magnitude difference between the amount of combinational delay between the normal and delayed data through the transmitter and their transition times will vary as a function of process, voltage and temperature. This makes the effectiveness of the blending strategy fairly unpredictable and uncontrollable at design time.

A further complication of delayed-data/blending edge rate control is that the process of delaying the data through combinational circuit elements results in added jitter on the delayed data path. This in turn can increase jitter on the transmitted output as a function of how much delay is desired. When a transmitter design targets a specific generation of a specification, and also provides legacy generation support, the jitter penalty associated with using delayed-data path edge rate control for the most current generation may be prohibitive, in which case, edge rate control would be reserved exclusively for legacy generation support.

Therefore, improvements in the control of rise and fall times of transmitted signals are desirable.

SUMMARY

In a first aspect, the present disclosure provides a method of adjusting the rise time and fall time of output signals generated by a voltage-mode differential transmitter (VMT). The method comprises: a) receiving at least one of a first output signal generated by a first driver of the VMT and a second output signal generated by a second driver of the VMT to obtain at least one received signal, the first driver including first inverter elements electrically connected to each other in parallel, the second driver including second inverter elements electrically connected to each other in parallel, each first inverter element and each second inverter element having a PMOS device and an NMOS device, the first output signal and the second output signal having a rise time and a fall time; b) processing the at least one received signal to determine if there is difference between the fall time and the rise time; and c) responsive to determining that there is a difference between the fall time and the rise time, modifying, in each of the first driver and the second driver, a ratio of a number of enabled PMOS devices to a number of enabled NMOS devices to reduce the difference between the fall time and the rise time.

In another aspect of the present disclosure, there is provided method of adjusting the rise time and fall time of output signals generated by a composite voltage-mode differential transmitter (CVMT). The method comprises: a) receiving at least one of a first output signal generated by a first set of drivers of the CVMT and a second output signal generated by a second set of drivers of the CVMT to obtain at least one received signal, the CVMT comprising unit cells, each unit cell having a driver of the first set of drivers and a driver of the second set of drivers, each driver of the first set of drivers including first inverter elements electrically connected to each other in parallel, each driver of the second set of drivers including second inverter elements electrically connected to each other in parallel, each first inverter element and each second inverter element having a PMOS device and an NMOS device, the first output signal and the second output signal having a rise time and a fall time; b) processing the at least one received signal to determine if there is difference between the fall time and the rise time; and c) responsive to determining that there is a difference between the fall time and the rise time, modifying, in each of the first driver and the second driver of at least one unit cell, a ratio of a number of enabled PMOS devices to a number of enabled NMOS devices to reduce the difference between the fall time and the rise time.

In yet another aspect, there present disclosure provides a method of controlling an edge rate of output signals generated by a composite voltage-mode differential transmitter (CVMT). The method comprises: a) determining an initial edge rate of a first output signal and a second output signal, the first output signal generated by a first set of drivers of the CVMT and the second output signal generated by a second set of drivers of the CVMT, the CVMT comprising unit cells, each unit cell having a driver of the first set of drivers and a driver of the second set of drivers, each driver of the first set of drivers including first inverter elements electrically connected to each other in parallel, each driver of the second set of drivers including second inverter elements electrically connected to each other in parallel, each first inverter element and each second inverter element having a PMOS device and an NMOS device, the first output signal and the second output signal having a rise time and a fall time; and b) in accordance with the initial edge rate and, in accordance with a target edge rate, modifying, in each of the first driver and the second driver of at least one unit cell, a ratio of a number of enabled PMOS devices to a number of enabled NMOS devices to modify the edge rate of the first output signal and the second output signal.

In a further aspect of the present disclosure, there is provided a voltage mode transmitter. The voltage mode transmitter comprises: a) first drivers and second drivers, the first drivers electrically connected to each other in parallel, the second drivers electrically connected to each other in parallel, each first driver including first inverter elements electrically connected to each other in parallel, each second driver including second inverter elements electrically connected to each other in parallel, each first inverter element and each second inverter element having a PMOS device and an NMOS device; b) sensor circuitry arranged to receive at least one of a first output signal produced by the first drivers and a second output signal produced by the second drivers, the first output signal and the second output signal having a rise time and a fall time, the sensor circuitry to determine, as function of the at least one of the first output signal and the second output signal, a difference between the rise time and the fall time, the sensor circuitry to generate a sensor circuitry output signal indicative of the difference between the rise and fall time; c) controller circuitry arranged to receive the sensor circuitry output signal and to generate a control signal as a function of the sensor circuitry output signal; and d) actuator circuitry arranged to receive the control signal, the actuator circuitry operationally coupled to the first drivers and to the second drivers, the actuator circuitry configured to enable or disable PMOS devices and to enable or disable NMOS devices in each of the first drivers and in each of the second drivers, as a function of the control signal, to reduce the difference between the fall time and the rise time.

In further aspect, the present disclosure provides a voltage mode transmitter that comprises: a) first drivers and second drivers, the first drivers electrically connected to each other in parallel, the second drivers electrically connected to each other in parallel, each first driver including first inverter elements electrically connected to each other in parallel, each second driver including second inverter elements electrically connected to each other in parallel, each first inverter element and each second inverter element having a PMOS device and an NMOS device, the first drivers to produce a first output signal, the second drivers to produce a second output signal, the first output signal and the second output signal each having an edge rate; and b) actuator circuitry arranged to receive an edge rate control signal, the actuator circuitry operationally coupled to the first drivers and to the second drivers, the actuator circuitry configured to enable or disable PMOS devices and to enable or disable NMOS devices in each of the first drivers and in each of the second drivers, as a function of the edge rate control signal, to control the edge rate of the first output signal and of the second output signal.

Other aspects and features of the present disclosure will become apparent to those ordinarily skilled in the art upon review of the following description of specific embodiments of the disclosure in conjunction with the accompanying figures.

BRIEF DESCRIPTION OF THE DRAWINGS

Embodiments of the present disclosure will now be described, by way of example only, with reference to the attached Figures, wherein:

FIG. 2A shows a prior art voltage mode transmitter.

FIG. 2B shows an inverter that is part of the transmitter of FIG. 2A.

FIG. 4 shows an eye diagram representative of delayed-data/blending edge rate control.

FIG. 18 shows signal traces obtained through edge rate control, in accordance with certain aspects of the present disclosure.

DETAILED DESCRIPTION

Generally, the present disclosure describes a method and apparatus to independently adjust the output rise and fall time of a transmitter. This can improve high-speed signaling characteristics, reducing electromagnetic interference (EMI), allow a transmitter to meet various data rate specifications, etc. The present disclosure can provide an alternative to the delayed-data/blending edge rate control commonly employed. The present disclosure can mitigate the shortcomings of the edge rate control approach related to unpredictability/uncontrollability over process, voltage, and temperature, the potential for increased jitter in full-rate applications, and "kinked" output waveforms.

As will be shown, in some embodiments, instead of disabling one of the multiple pull-up or pull-down paths of a CMOS inverter-like driver to affect the relative magnitude of $R_{PU}$ and $R_{PD}$ for the purposes of equalizing them, CMOS inverter-like driver pull-up and pull-down paths can be simultaneously disabled to preserve the relative magnitude of $R_{PU}$ and $R_{PD}$ while serving to increase both of them symmetrically. The increase in $R_{PU}$ and $R_{PD}$ serves to increase the pull-up and pull-down RC time constants at the transmitter output and result in slower rise and fall times.

As stated above, rise/fall times at the outputs of a high-speed serial transmitter are dependent on RC time constants that are defined by the impedance of the load and the resistance of the pull-up (rise time) and pull-down (fall time) paths of the transmitter. This was illustrated at FIGS. 2A and 2B. Rise and fall times can be expressed as in Equation 3, which is the same as Equation 1.

$$t_{rise} \propto (R_{PU} \| R_L) C_L \qquad \text{Equation 3}$$
$$t_{fall} \propto (R_{PD} \| R_L) C_L$$

As mentioned above, in relation to FIGS. 3A and 3B, the pull-up and pull-down path resistances ($R_{PU}$ and $R_{PD}$, respectively) of the composite transmitter of FIG. 3A is given by Equation 42, which, for convenience, is shown below as Equation 4, and is comprised of a shared series resistor component ($R_{SER}$) and a device portion unique to each of the pull-up ($r_{PMOS}$) and pull-down ($r_{NMOS}$) paths found within the CMOS inverter-like output driver in each unit drive cell.

$$R_{PU} = R_{SER} + r_{PMOS}$$

$$R_{PD} = R_{SER} + r_{NMOS} \qquad \text{Equation 4}$$

Figure 1:
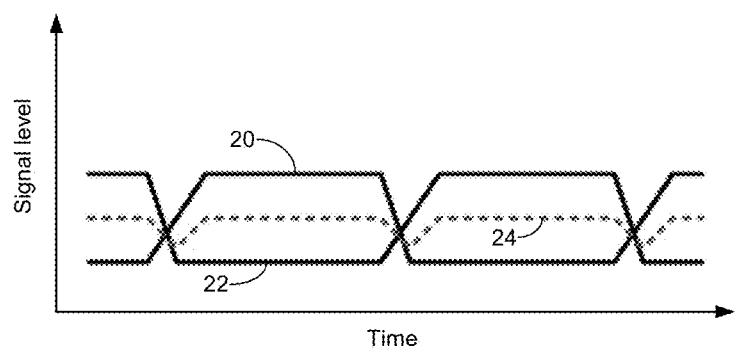
FIG. 1 shows differential outputs of a voltage mode transmitter and a common mode signal of the voltage mode transmitter.
Figures 3A, 3B:
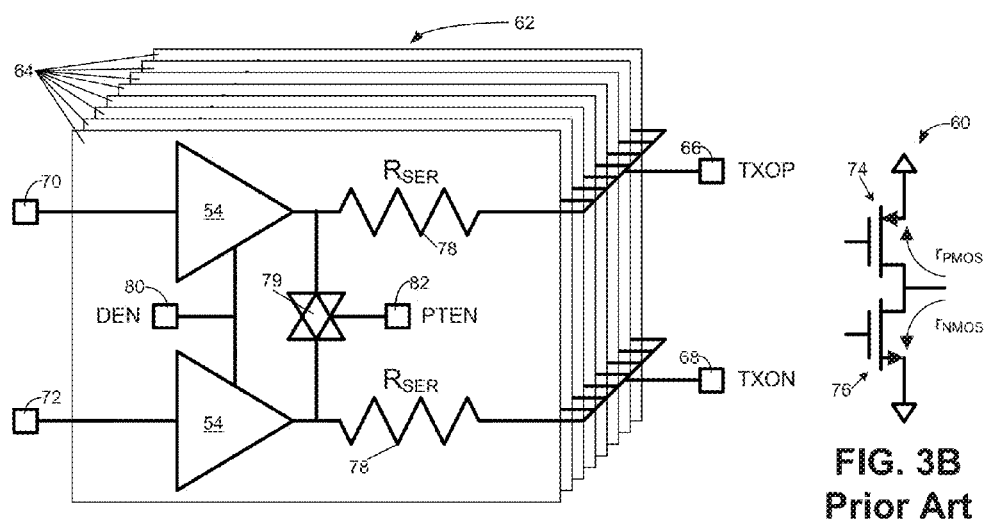
FIG. 3A shows a prior art composite voltage mode transmitter.
FIG. 3B shows an inverter element that is part of the transmitter of FIG. 3A.
Figure 5:
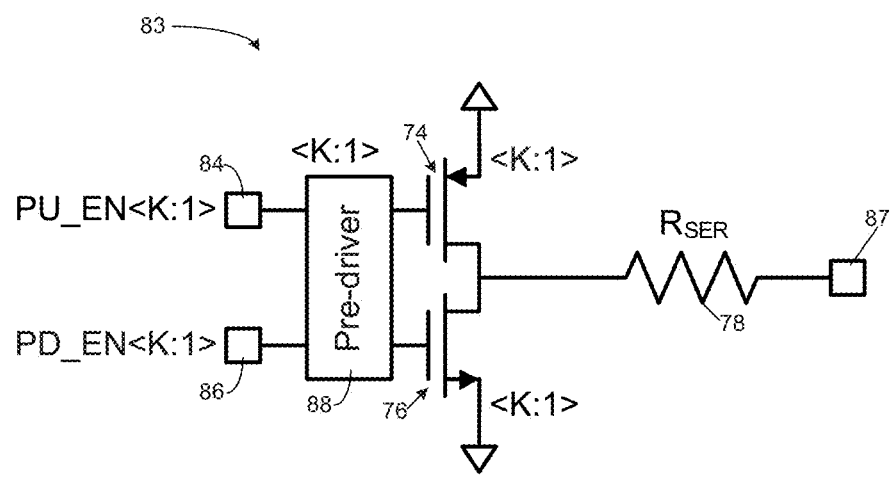
FIG. 5 shows, in accordance with certain embodiments of the present disclosure, an inverter device that includes K independently controllable PMOS devices 74 the K independently controllable NMOS devices.

The present disclosure replaces the CMOS inverter element 60, shown at FIG. 3B, with two or more (K>1) independently controllable inverter elements each having a PMOS device and an NMOS device. FIG. 5 shows an inverter device or structure 83 that includes the aforementioned K independently controllable PMOS devices 74 and the K independently controllable NMOS devices 76. In the embodiment of FIG. 5, it is possible to disable one or more pull-up elements (PMOS devices 74) and/or pull-down elements (NMOS devices 76) that comprise a portion of the path resistances to which a data signal is subjected. The drive enable (DEN 80) control port of FIG. 3A now becomes, K independent pull-up enable ports (PU_EN<K:1>), shown at reference numeral 84 of FIG. 5, and K independent pull-down enable ports (PD_EN<K:1>), shown at reference numeral 86. When a PU_EN or PD_EN control signal is asserted, the appropriate data signal (e.g., a data signal or the inverted data signal) is applied by pre-driver circuitry 88, to the corresponding PMOS or NMOS devices, which are part of the output driver. When a PU_EN control signal is de-asserted, the pre-driver circuitry 88 is set such that the gate terminal of the corresponding PMOS device in the output driver is pulled to the positive supply to disable it. Similarly, when a PD_EN control signal is de-asserted, pre-driver circuitry 88 is set such that the gate terminal of the corresponding NMOS device in the output driver is pulled to ground to disable it. Disabling one or more PMOS or NMOS devices in this manner serves the purpose of increasing the device portion of the path resistance of the unit drive cell in moderately coarse steps, as expressed by Equation 5. That is, disabling one or more sub-cells (a sub-cell can include a PMOS device 74 or an NMOS device 76) serves the purpose of increasing the device portion of the path resistance of the unit drive cell in moderately coarse steps.

$$R_{PU} = R_{SER} + \frac{K}{k_p} \cdot r_{pmos} \qquad \text{Equation 5}$$

$$R_{PD} = R_{SER} + \frac{K}{k_n} \cdot r_{nmos}$$

$$k_{p,n} \in \{1 : K\}$$

Figure 6:
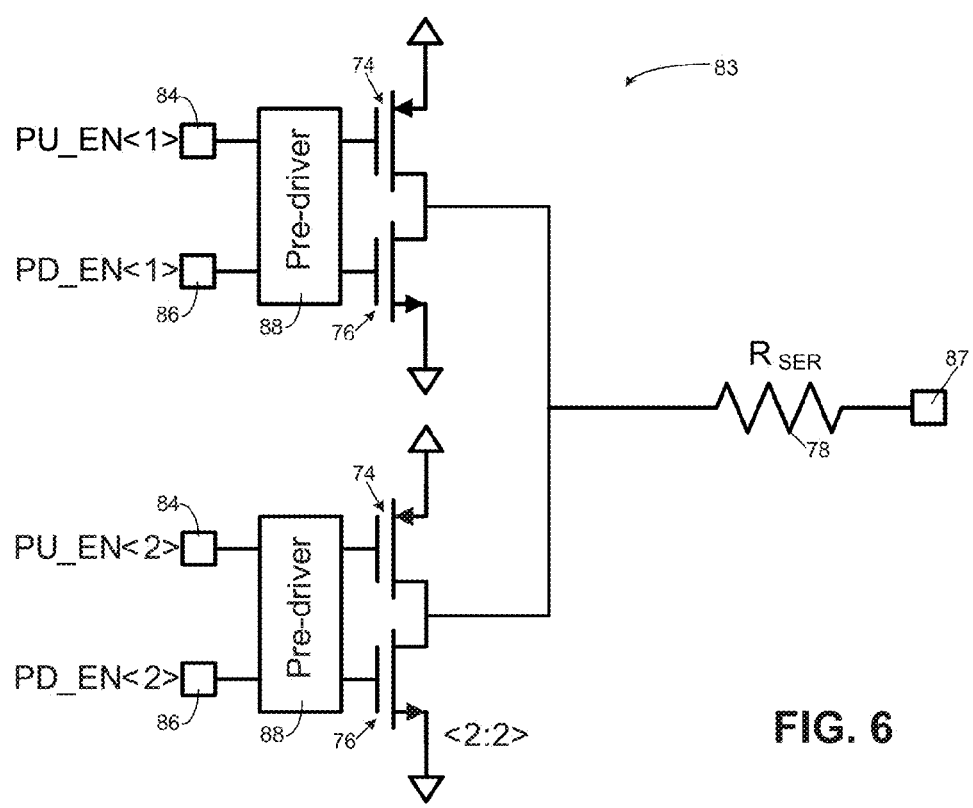
FIG. 6 shows an example of the inverter device of FIG. 5 with K=2.

As an example, with respect to $R_{PU}$, if K=2 but only one of the PMOS devices is being used, i.e., $k_p$=1, then $R_{PU}$=$R_{SER}$+$2r_{pmos}$, which is greater than if both PMOS devices are used ($k_p$=2; $R_{PU}$=$R_{SER}$+$r_{pmos}$). FIG. 6 shows another representation of FIG. 5 in an example where K=2. Each of FIGS. 5 and 6 show an output port 87 at which an output data signal is provided.

The moderately coarse adjustment enabled by replacing the inverter element 60 (FIG. 3B) with the inverter device or structure 83 (FIG. 5), which includes K inverter elements, becomes a fine adjustment when applied to each drive cell of a composite voltage mode transmitter such as shown at reference numeral 62 of FIG. 3A. With N independently controllable unit drive cells, the effect of a moderately coarse path resistance adjustment in a single unit cell is attenuated from the perspective of the composite transmitter path resistance. Thus, in some embodiments, the present disclosure effectively provides a fine-tuning mechanism for the path resistances of composite voltage mode transmitters.

Referring again to FIG. 3A, if the voltage mode transmitter 62 were to be adapted in accordance with the present disclosure, one or both drivers 54 would have their inverter element 60, shown at FIG. 3B, replaced with the inverter device 83 shown at FIG. 5. Referring yet again to FIG. 3A, in a scenario where portions of the CMOS inverter-like structures of a unit drive cell (configured for drive mode) are to be disabled to affect the pull-up or pull-down path resistance, an analogous adjustment should be made to the transmission gate 79 whenever the unit drive cell is configured for parallel termination. To achieve this, the transmission gate itself should also be split into multiple transmission gate elements, with individual control signals to enable/disable the PMOS device (analogous to PU_EN control for drive mode) and the NMOS device (analogous to PD_EN control for drive mode) in each transmission gate element.

Figure 7A:
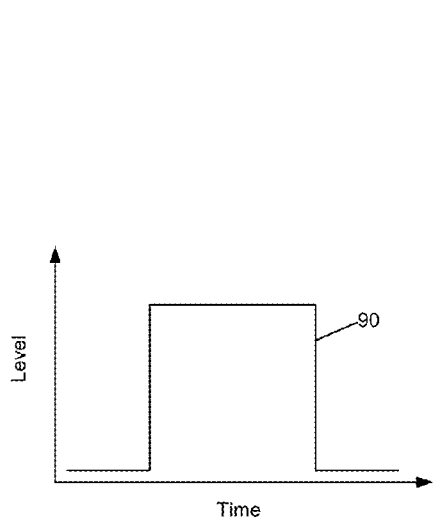
FIGS. 7A-7E show examples of how a data signal input into the inverter device of FIG. 6 can be output of the inverter device as a function of enabled and disabled PMOS and NMOS devices of the inverter device.
Figure 7B:
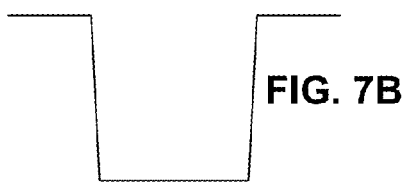
Figure 7C:
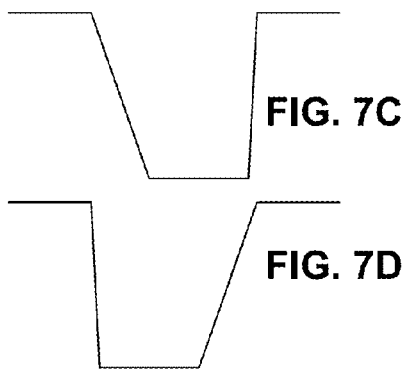
Figure 7D:
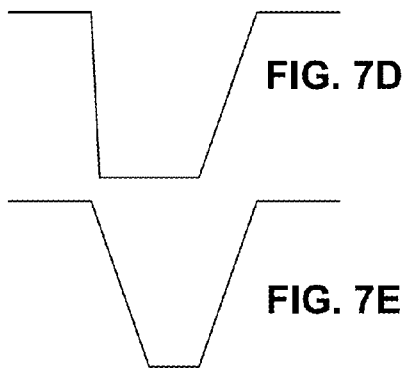
Figure 7E:
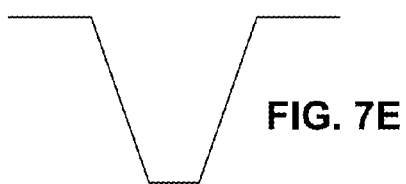

FIGS. 7A-7E show examples of how an input data signal 90 shown at FIG. 7A is output from the inverter device 83 of FIG. 6, for different settings of the PU_EN 84 and PD_EN 86 ports. FIG. 7B shows the data signal output at the port 87 of FIG. 6 when each of PU_EN<1>, PU_EN<2>, PD_EN<1>, and PD_EN<2> are asserted. As shown in FIG. 7B, the rise and fall time are essentially the same, i.e., $R_{PU}$ and $R_{PD}$ are essentially the same. FIG. 7C shows the data signal output when PD_EN<1> is de-asserted and PU_EN<1>, PU_EN<2>, and PD_EN<2> are asserted. FIG. 7D shows the data signal output when PU_EN<1> is de-asserted and PU_EN<2>, PD_EN<1>, and PD_EN<2> are asserted. FIG. 7E shows the data signal output when PD_EN<1> and PU_EN<1> are de-asserted and PU_EN<2> and PD_EN<2> are asserted.

Figure 8A:
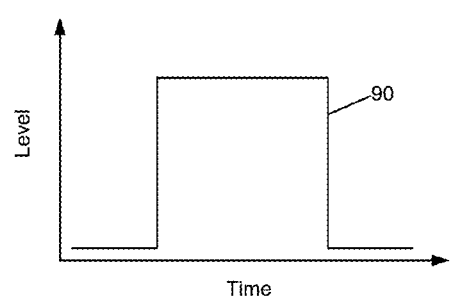
FIGS. 8A-8C shows other examples of how a data signal input into the inverter device of FIG. 6 can be output of the inverter device as a function of enabled and disabled PMOS and NMOS devices of the inverter device.
Figure 8B:
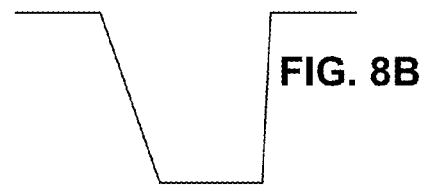
Figure 8C:
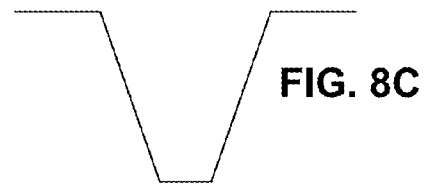

In another example, FIGS. 8A-8C show how an input signal data 90 shown at FIG. 8A is output from an inverter similar to the inverter device 83 of FIG. 6 but with different PMOS and NMOS resistances and for different settings of the PU_EN 84 and PD_EN 86 ports. FIG. 8B shows the data signal output at the port 87 of FIG. 6 when each of PU_EN<1>, PU_EN<2>, PD_EN<1>, and PD_EN<2> are asserted. As shown in FIG. 8B, the rise and fall times are different: the fall time is longer than the rise time, which means that $R_{PD}$ is longer than $R_{PU}$. FIG. 8C shows the data signal output when PU_EN<1> is de-asserted and PU_EN<2>, PD_EN<1> and PD_EN<2> are asserted, which, in this example, produces a more symmetrical output with substantially equal rise and fall times.

Figure 9:
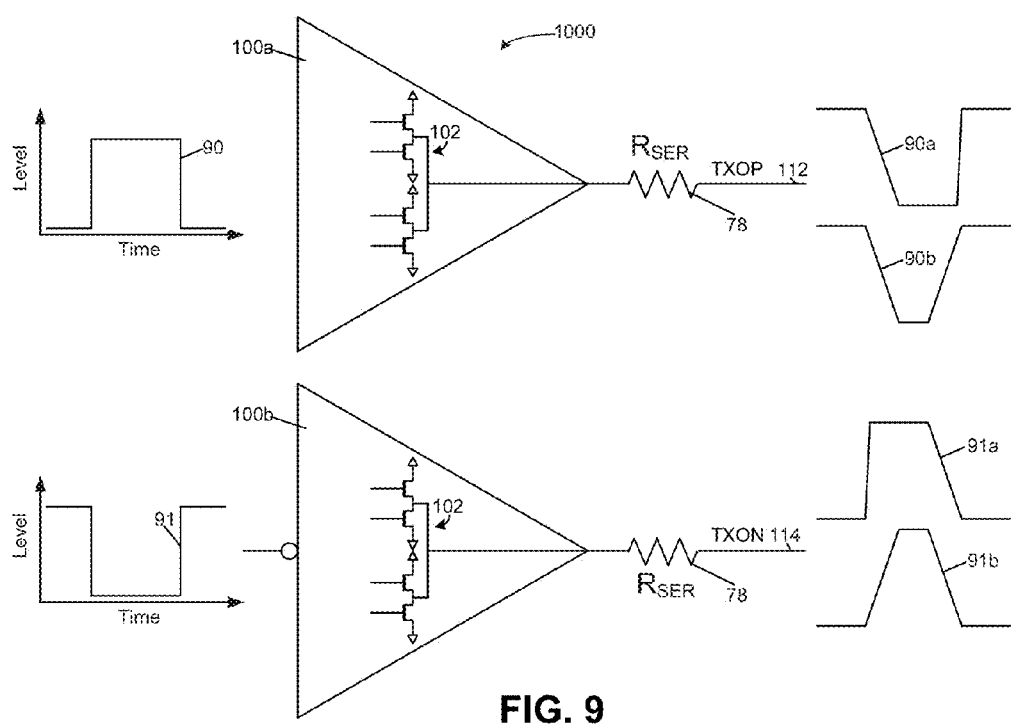
FIG. 9 shows circuitry elements of a voltage mode transmitter, in accordance with certain embodiments of the present disclosure.

FIG. 9 shows circuitry elements of a voltage mode transmitter 1000 that includes two CMOS drivers 100a and 100b each comprising an inverter device 102, which, in this embodiment, is functionally equivalent to the inverter device 83 of FIG. 5, with K=2. Input into the CMOS driver 100a is an input data signal 90 and, input into the CMOS driver 100b is an input data signal 91. The input data signals 90 and 91 are complementary to each other in the sense that summing the input data signals 90 and 91 with each other would produce a sum signal that is uniform as a function of time (i.e., the sum signal would have a constant level). In this example, when all the enable signals of the PMOS and NMOS devices of the inverter devices 102 are asserted, the voltage mode transmitter outputs the data signal 90a and 91a, which both have fall time larger that the rise time. To correct this, one of the PMOS devices of the CMOS driver 100a is de-asserted and one of the PMOS devices of the CMOS driver 100b is de-asserted. This results in the output data signal 90b and 91b, which have similar rise and fall time.

Practically, for pairs of CMOS drivers such as 100a and 100b of FIG. 9, the output rise time of one will be substantially equal to the output rise time of the other, and the output fall time of one will be substantially equal to the output fall time of the other. This is due to the CMOS drivers being fabricated on a same chip under the same conditions and in proximity to each other. Some random variations between the rise/fall times of one CMOS driver with respect to the rise/fall times of the other CMOS driver can exist but are typically not dominant contributors to any rise/fall times mismatch at the outputs of a composite transmitter.

A closed-loop apparatus and method by which the mismatch in transmitter output rise and fall times can be equalized are described below. The apparatus has a number of key components: an actuator used to adjust the rise or fall time, a sensor to measure the degree of rise/fall time mismatch, a comparison stage to digitize the sensor output, and a calibration block that determines a corrective input stimulus for the actuator.

Embodiments of the method and apparatus of the present disclosure describe a closed-loop calibration system including an actuation apparatus within the transmitter driver, a sensing means at the output of the transmitter to measure the degree of rise/fall time imbalance, and a calibration state machine operating on the sensor output to devise correction control inputs to the actuator in the transmitter driver to correct the rise/fall time imbalance.

An example of a sensing means described below measures the average value of a quantity related to the transmitter differential output signals TXOP and TXON. This can be the average of the common-mode signal (TXOP+TXON)/2, or the average of TXOP and/or TXON directly. The sensing means further compares the measured quantity against a reference voltage using a comparator. When pull-up and pull-down path resistances are balanced to make rise and fall times equal, the common-mode voltage is typically close to half of the supply voltage $V_{DD}$. Thus, the reference voltage could be $V_{DD}/2$, or it may be set to another voltage, for example, with a digital to analog converter (DAC), to compensate for other effects such as leakage, random offsets, etc. The output of the sensing means is a signal that indicates if the transmitter rise time is faster than the fall time ($R_{PU}<R_{PD}$), or vice versa ($R_{PU}>R_{PD}$).

As will be shown below, a calibration block takes the digital output of the sensing means and determines an appropriate control signal modification to the actuation apparatus. The control signal modification serves to disable additional CMOS inverter-like driver components to increase the smaller of $R_{PU}$ or $R_{PD}$ to make it more closely match the larger of $R_{PU}$ or $R_{PD}$.

Figure 10:
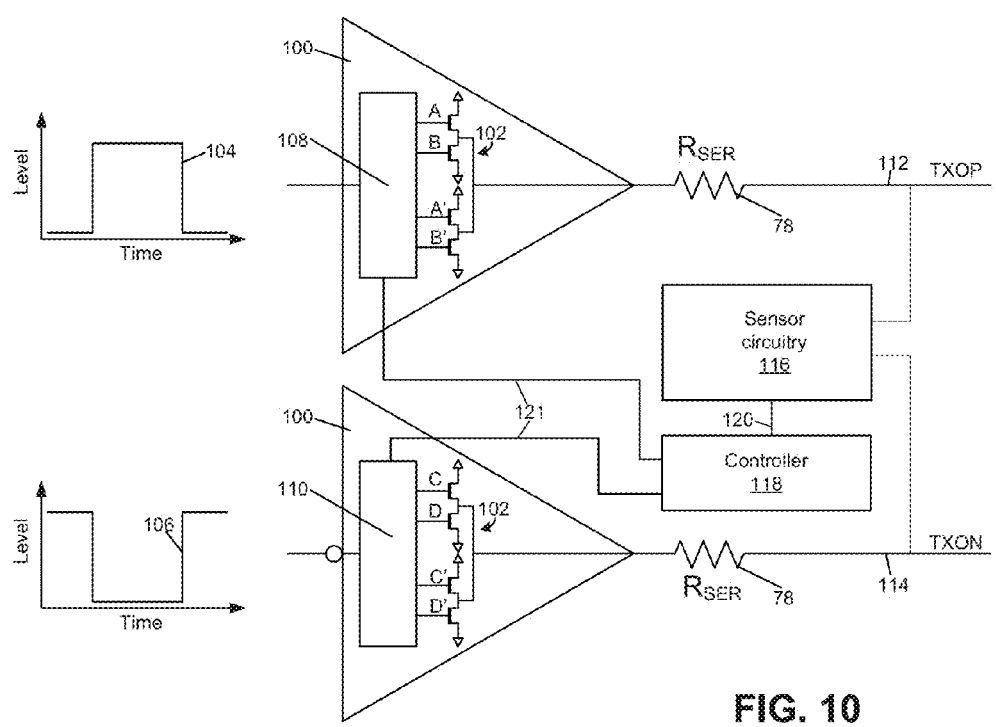
FIG. 10 shows the circuitry elements of a voltage mode transmitter of FIG. 9, coupled to sensor circuitry, a controller, and actuator circuitries, in accordance with certain embodiments of the present disclosure.

FIG. 10 shows two CMOS drivers 100, each comprising an inverter device 102, which in this embodiment, is functionally equivalent to the inverter device 83 of FIG. 5, with K=2. A voltage mode transmitter can include several of these pairs of CMOS drivers formed on different unit cells electrically connected in parallel (such unit cells 64 are shown in the multiple cell voltage mode transmitter 62 of FIG. 3A). Referring again to FIG. 10, one of the CMOS drivers 100 receives a data signal 104 and the other CMOS driver 100 receives a data signal 106, which is the same as the data signal 104, but inverted. The data signal 104 is input to actuator circuitry 108 and the data signal 106 is input to actuator circuitry 110. The actuator circuitries 108 and 110 include pre-driver circuitry such as that shown in FIG. 6.

The data signals 104 and 106 are driven by their respective drivers 100 to produce driven data signals 112 and 114 respectively, which can also be referred to as the differential outputs TXOP and TXON respectively. The driven data signals 112 and 114 are both provided to sensor circuitry 116, which can measure and/or compare the driven data signals 112 and 114 in any suitable way to determine if the rise and fall times differ or if they are the same. As a function of the measurement or comparison, of the driven data signals 112 and 114, the sensor circuitry 116 provides a sensor circuitry signal 120 to a controller 118, which controls the actuator circuitries 108 and 110. In effect, the actuator circuitries 108 and 110 assert or de-assert the pull-up enable ports and pull-down enable ports that are comprised in the actuator circuitries. The controller 118 can provide a code 121 (control signal) to the actuator circuitries 108 and 110, the code 121 specifying which pull-up enable ports and which pull-down enable ports to assert or de-assert. The actuator circuitries 108 and 110 act as switching modules that simply enable or disable the pull-up enable ports and the pull-down enable ports in accordance with the code 121. The actuator circuitries can have any suitable circuitry configuration and can include any suitable components, as would be understood by the skilled worker. As an example, a current-starved inverter can be used in the actuator circuitries.

In FIG. 10, the signals A and A' applied at the gates of the respective PMOS devices will be the input signal 104 if the enable port of each of these PMOS devices is asserted. If, rather than asserted, these enable ports are de-asserted, the signals A and A' are equal to that of the positive power supply of the PMOS devices and these devices are disabled. The signals B and B' applied at the gates of the respective NMOS devices will be the input signal 104 if the enable port of each of these NMOS devices is asserted. If, rather than asserted, these enable ports are de-asserted, the signals B and B' are equal to that of the negative power supply of the NMOS devices and these devices are disabled.

Also in FIG. 10, the signals C and C' applied at the gates of the respective PMOS devices will be the input signal 106 if the enable port of each of these PMOS devices is asserted. If, rather than asserted, these enable ports are de-asserted, the signals C and C' are equal to that of the positive power supply of the PMOS devices and these devices are disabled. The signals D and D' applied at the gates of the respective NMOS devices will be the input signal 106 if the enable port of each of these NMOS devices is asserted. If, rather than asserted, these enable ports are de-asserted, the signals D and D' are equal to that of the negative power supply of the NMOS devices and these devices are disabled.

Figure 11:
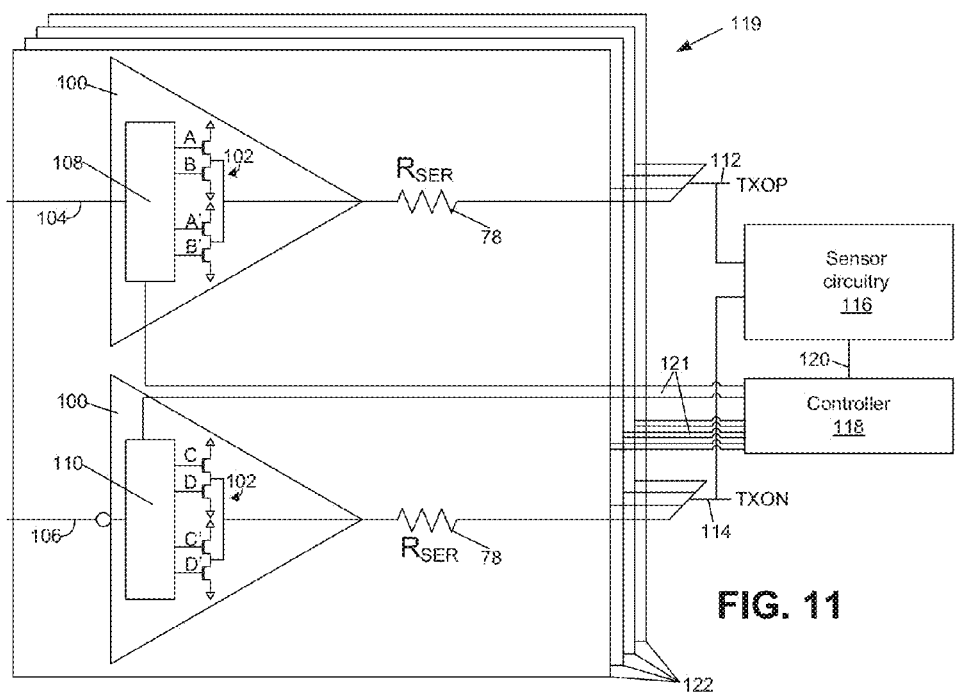
FIG. 11 shows a composite voltage mode transmitter in accordance with certain embodiments of the present disclosure.

FIG. 11 shows a voltage mode transmitter 119 having four unit cells 122 electrically connected to each other in parallel. The voltage mode transmitter 119 is an example of a composite transmitter (i.e., a transmitter comprising two or more unit cells). The input data signal 104 and 106 are provided to each of the unit cells 122. The input data signals 104 and 106 are complementary to each other in the sense that summing the input data signals 104 and 106 with each other would produce a sum signal that is uniform as a function of time (i.e., the sum signal would have a constant level). As in the example of FIG. 10, the driven data signal 112 and 114 (TXOP and TXON) are provided to the sensor circuitry 116, which can measure and/or, compare the driven data signals 112 and 114 in any suitable way to determine if the rise and fall times differ or if they are the same. As a function of the measurement and/or comparison of the driven data signals 112 and 114, the sensor circuitry 116 provides a sensor circuitry signal 120 to a controller 118, which controls the actuator circuitries 108 and 110 of each of the four unit cells 122. In effect, the actuator circuitries 108 and 110 assert or de-assert the pull-up enable ports 84 and pull-down enable ports 86 that are comprised in the actuator circuitries. The controller 118 can provide a code 121 to the actuator circuitries 108 and 110 of each unit cell to specify which pull-up enable ports 84 and which pull-down enable ports to assert or de-assert in order to equalize the rise and fall times of the driven data signals 112 and 114 or shape these rise and fall times in any other suitable way. Although shown as part of the transmitters 100, the actuation circuitries 108 and 110 do not strictly have to be part of these transmitters.

Figure 12:
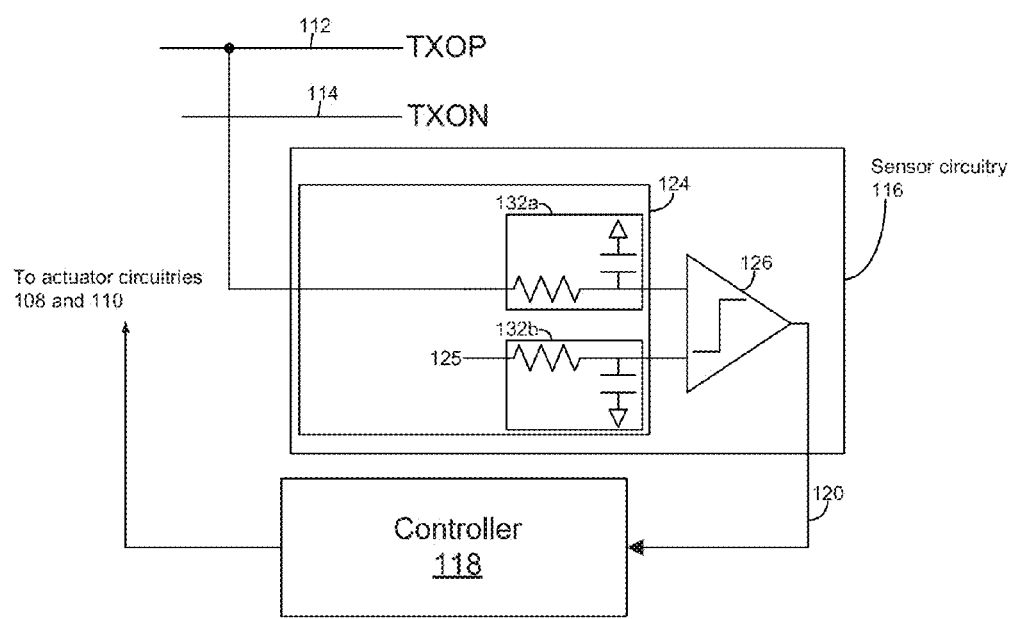
FIG. 12 shows an embodiment of sensor circuitry and a controller, in accordance with certain embodiments of the present disclosure.

FIG. 12 shows an embodiment of the sensor circuitry 116 and controller 118 of FIG. 11. In this embodiment, the sensor circuitry 116 includes a sensor sub-circuit 124 and a comparator circuit 126. The sensor sub-circuit 124 includes an RC filter 132a that receives the driven data signal 112 (TXOP). The RC filter 132a performs an analog averaging operation on the signal that is applied to it. When TXOP (112) is connected to the input as in FIG. 12, what is observed at the output of the RC filter 132a is a waveform whose average value is, when the rise and fall times are substantially equal, the same as the average of TXOP (substantially equal to VDD/2) with small ripples corresponding to the locations of data transitions on TXOP. The sensor sub-circuit 124 generates (or receives) a reference signal 125 that is provided to an RC filter 132b. The output of the RC filter 132a and the output of the RC filter 132b are provided as input to the comparator circuit 126. The comparator circuit 126 outputs a signal indicative of any mismatch between the output of the RC filter 132a and the output of the RC filter 132b. The mismatch between these signals is indicative of a mismatch between the rise time and the fall time of TXOP. The comparator circuit 126 outputs a sensor circuitry signal 120 to the controller 118, which in turn outputs a code 121 to the actuators circuitries 108 and 110, to de-assert or assert the enable signals of the PMOS and NMOS devices in the CMOS drivers (see FIG. 10, reference numerals 100).

Figure 13:
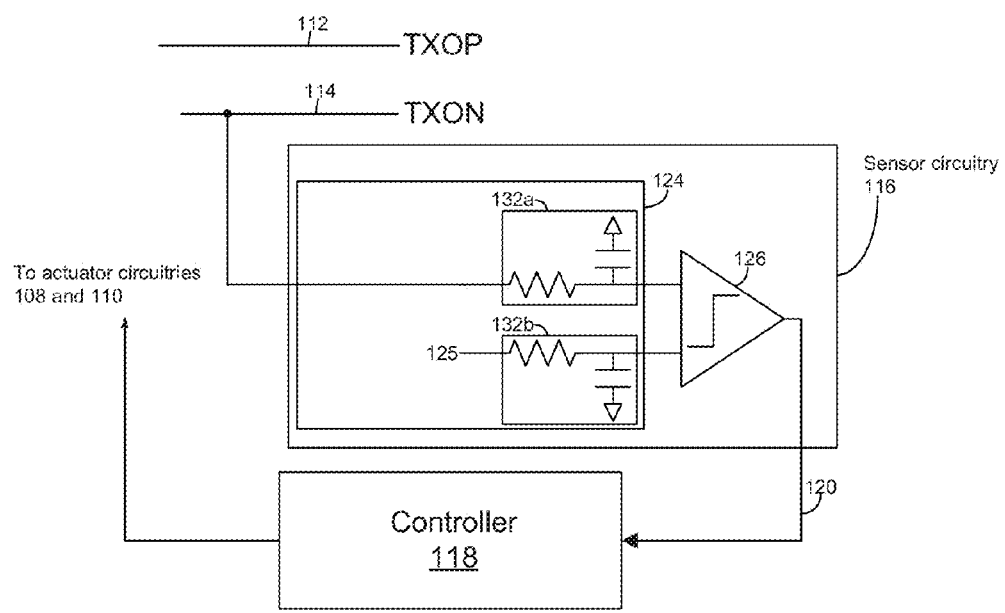
FIG. 13 shows another embodiment of sensor circuitry and a controller, in accordance with certain embodiments of the present disclosure.

FIG. 13 shows another embodiment of the sensor circuitry 116 and controller 118 of FIG. 11. In this embodiment, the sensor circuitry 116 includes the sensor sub-circuit 124 and a comparator circuit 126. The sensor sub-circuit 124 includes an RC filter 132a that receives the driven data signal 114 (TXON). The RC filter 132a performs an analog averaging operation on the signal that is applied to it. When TXON (114) is connected to the input as in FIG. 13, what is observed at the output of the RC filter 132a is a waveform whose average value is, when the rise and fall times are substantially equal, the same as the average of TXON (substantially equal to VDD/2) with small ripples corresponding to the locations of data transitions on TXON. The sensor sub-circuit 124 generates (or receives) the reference signal 125 that is provided to the RC filter 132b. The output of the RC filter 132a and the output of the RC filter 132b are provided as input to the comparator circuit 126. The comparator circuit 126 outputs a signal indicative of any mismatch between the output of the RC filter 132a and the output of the RC filter 132b. The mismatch between these signals is indicative of a mismatch between the rise time and the fall time of TXOP. The comparator circuit 126 outputs a sensor circuitry signal 120 to the controller 118, which in turn outputs a code 121 to the actuators circuitries 108 and 110, to de-assert or assert the enable signals of the PMOS and NMOS devices in the CMOS drivers (see FIG. 10, reference numerals 100).

Figure 14:
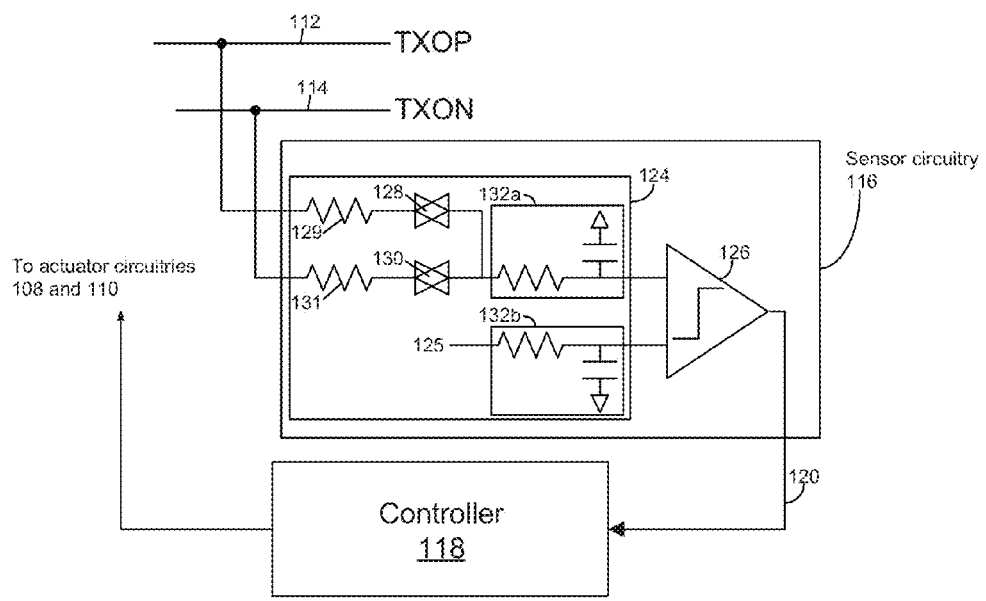
FIG. 14 shows yet another embodiment of sensor circuitry and a controller, in accordance with certain embodiments of the present disclosure.

FIG. 14 shows another embodiment of the sensor circuitry 116 of FIG. 11. In this embodiment, the sensing circuitry 116 includes a sensor sub-circuit 124 and a comparator sub-circuit 126. The sensor sub-circuit 124 has a transmission gate 128 that receives the driven data signal 112 (TXOP) through a resistor 129, and a transmission gate 130 that receives the driven data signal 114 through a resistor 131. Each transmission gate 128 and 130 provides its output to an RC filter 132a. As such, the inputs to the sensor circuitry 116 and to the sensor sub-circuit 124 can include the differential outputs TXOP and TXON of the transmitter. By enabling transmission gate 128 and not enabling the transmission gate 130, the average value signal value of the positive transmitter output polarity (TXOP) (this is the average value of the driven data signal 112) is provided at the output of the RC filter 132a (this is similar to the embodiment of FIG. 12). Similarly, by enabling the transmission gate 130 and not enabling the transmission gate 128, the average value of the negative transmitter output polarity (TXON) (this is the average value of the driven data signal 114) is provided at the output of the RC filter 132a (this is similar to the embodiment of FIG. 13). If both transmission gates 128 and 130 are simultaneously enabled, the RC filter 132a performs an analog averaging operation on the signal TXOP+TXON, which is equal to (average(TXOP)+average(TXON))/2=VDD/2, when the rise and fall times are substantially equal.

The sensor sub-circuit 124 generates (or receives) a reference signal 125 that is provided to an RC filter 132b. In the examples of FIGS. 12-14, the reference signal 125 should be set such that the output of the RC filter 132b is equal to VDD/2. As will be understood by the skilled worker, the reference voltage can have any suitable value close to VDD/2 without departing from the scope of the present disclosure. The output of the RC filter 132a and the output of the RC filter 132b are provided as input to the comparator circuit 126. The comparator circuit 126 outputs a signal indicative of any mismatch between the output of the RC filter 132a and the output of the RC filter 132b. The mismatch between these signals is indicative of a mismatch between the rise time and the fall time of TXOP and TXON. The comparator circuit 126 outputs a sensor circuitry signal 120 to the controller 118, which in turn outputs a code 121 to the actuators circuitries 108 and 110, to de-assert or assert PMOS and NMOS devices in the CMOS drivers (see FIG. 10, reference numerals 100).

Figure 15:
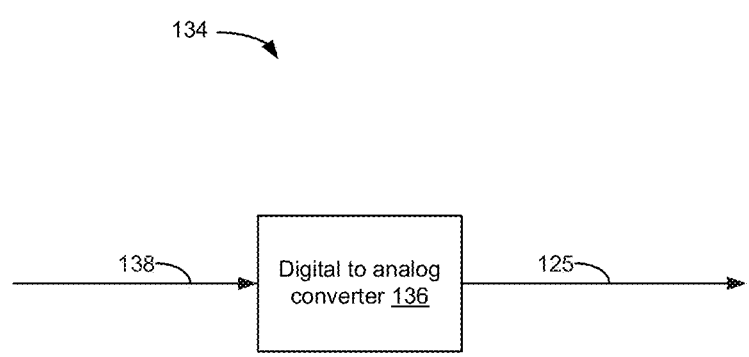
FIG. 15 shows elements of a signal generator circuitry that can be used to generate the reference signal, in accordance with certain embodiments of the present disclosure.

FIG. 15 shows elements of a signal generator circuitry 134 that can be used to generate the reference signal 125. The signal generator circuitry 134 includes a digital to analog converter 136 that receives a code 138 and transforms the code into an analog reference signal 125.

In other embodiment, the sensor circuitry 116 can include a sampler that could be very similar to the comparator of FIG. 14, but would have a clock input which would define the moments in time at which the data input is compared to the reference. In such an embodiment, the reference voltage would be adjusted at each clock cycle to determine the peak voltages (maximum and minimum) of the common-mode waveform (TXOP+TXON)/2. The reference voltage at which the comparison operation changes output polarity would indicate what the peak voltages are. In response to these peak voltage measurements, the controller would adjust the actuator circuitries with the intention of making the peak-to-peak voltage of the common-mode waveform become smaller. After an adjustment, the sampling operation of TXOP+TXON is performed again to see what the new peak voltages are. This process repeats until the peak voltages are smaller than the incremental value of the DAC that produces the reference voltage.

The comparator sub-circuit 126 shown in the examples above performs a comparison operation between its inputs, and outputs a signal indicating which input is larger than the other. In its simplest form, the comparator sub-circuit can be an analog comparator. In a digitally-assisted closed-loop implementation, the comparator sub-circuit 126 can be followed by some form of limiting amplifier (e.g., a clocked sense-amplifier with regenerative feedback) to amplify the analog comparator output to signal voltage levels corresponding to standard digital logic circuitry "1" or "0". Alternatively, the output of the comparator sub-circuit 126 can be used in an analog closed-loop implementation or in a mixed analog/digital implementation. As an example of an analog closed-loop implementation, one could take the output of an analog comparator and use it in some form of analog opamp-based closed-loop feedback system to drive the actuator circuitries.

In the examples above, the controller 118 takes the output from the comparator sub-circuit 126 as its input. The purpose of the controller 118 is to devise an appropriate control signal change for the actuator that serves to reduce the detected mismatch in $R_{PU}$ and $R_{PD}$ (i.e., the detected mismatch between the rise aforementioned and fall times). In some embodiments of the present disclosure, the calibration block is, or includes, a digital state machine and the sensor circuitry signal 120 is a digital signal generated, from the output of the comparator circuit 126, using any suitable means of digitization (e.g., an analog to digital converter). An example of a state machine 150 is shown at FIG. 16; the state machine 150 can be part of any suitable controller such as, the various embodiments of the controller 118 described above in relation to FIGS. 10 to 14.

Figure 16:
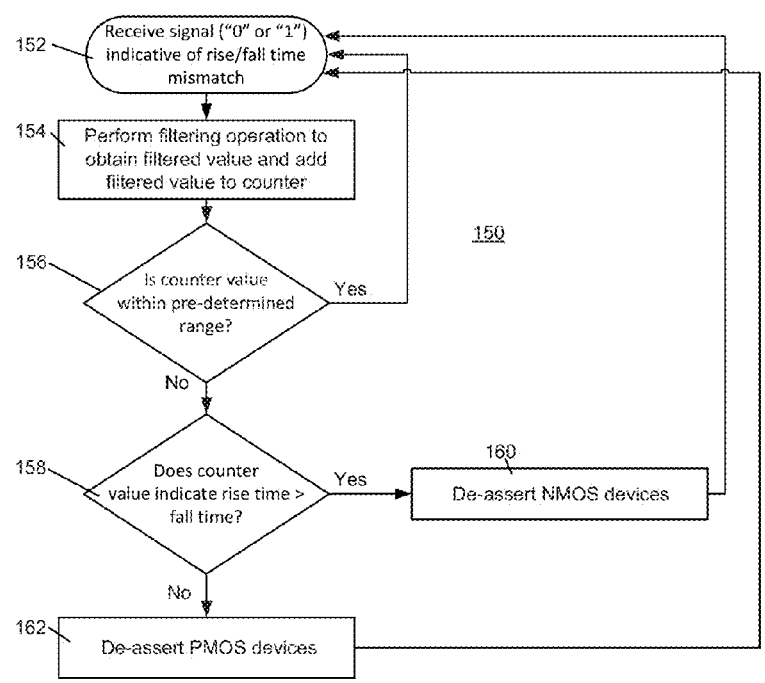
FIG. 16 shows a state machine in accordance with certain embodiments of the present disclosure.

Returning to the example of FIG. 16, the state machine 150 receives, at reference numeral 152, a signal indicative of a mismatch of rise and fall times in a transmitter. For example, the signal received by the state machine 150 can be a digitized equivalent of the sensor circuitry signal 120 of FIG. 11. In some embodiments, the signal received by the state machine 150 can have a value of "1", which can indicate that the rise time is greater than the fall time, or a value of "0", which can indicate that the rise time is smaller than the fall time.

At 154, the state machine 150 can perform digital filtering on the input signal The digital filtering can essentially dictate how quickly the state machine 150 will respond to the sensor circuitry signal 120 (or to its digitized equivalent). The digital filtering performed at 154 results in a filtered value, which can be calculated in any suitable way. For example, each time the signal received at 152 is a "1", the filtered value can be "1" and can be added to a counter, which contains previously obtained filtered values; each time the signal received at 152 is "0", the filtered value can be "−1" and can be added to the counter.

At 156, it is determined if the counter value is within a pre-determined range defined by pre-established range limits. For example, the upper range limit could be 50 and the lower range limit could be −50. If the counter value is within the pre-determined range, the state machine 150 can proceed from 156 back to 152 immediately or after a pre-determined wait period. If the counter value is outside the pre-determined range, the state machine can proceed to 158 where it is determined if the counter value indicates that the rise time is greater that the fall time (counter value greater than pre-established upper range limit). Is so, the state machine goes to 160 where an enable state of an NMOS device is (or enable states of multiple NMOS devices are) de-asserted in order to increase the fall time. Otherwise, if, at 158, it is determined that he rise time in not greater than the fall time (counter value is less that pre-established lower range limit), the state machine goes to 162 where an enable state of a PMOS device is (or enable states of multiple PMOS devices are) de-asserted in order to increase the rise time. After 160, the state machine can proceed back to 152 immediately or after a pre-determined wait period; after 162, the state machine can proceed back to 152 immediately or after a pre-determined wait period. The counter can be reset to an initial value (e.g., zero) after 160 or 162. The counter can also be reset prior to 152.

When the actuator circuitry settings are about optimal, the signal received by the state machine 150 will alternate between 1 and 0 and the counter value will stay within the pre-determined range. At that point, the loop has converged and the actuator circuitry settings are held in a static (presumably optimal) configuration.

In a voltage mode transmitter having multiple unit cells such at the voltage mode transmitter 119 of FIG. 11, there can be many options with respect to the order in which NMOS or PMOS devices are de-asserted to equilibrate (equalize) the aforementioned rise and fall times. For example, if two enable signals of two NMOS device (one per CMOS driver) has been de-asserted in a first unit cell of a composite voltage mode transmitter in order to increase the fall time and, it is found that the resulting fall time is still shorter that the rise time, the next pair of NMOS devices to be disabled can be on the same unit cell or on another unit cell. Alternatively, instead of disabling another pair of NMOS devices on the other unit cell, one could disable two pairs of NMOS devices on the other unit cell and, enable the disabled pair of NMOS devices on the first unit cell. One skilled in the art will recognize the latter approach as being akin to binary coding and the former approach a thermometer coding. Table 1 shows and example applicable to a four unit cell composite transmitter. In this example, if one pair on MOS devices (NMOS or PMOS) is to be disabled, the single pair can be disabled in the first unit cell, regardless of whether thermometer or binary coding is used.

If two pairs of MOS devices are to be disabled, using thermometer coding, one pair will be disable in the first unit cell and another pair will be disabled in the second unit cell; using binary coding, two pairs will be disabled in the second unit cell.

If three pairs of MOS devices are to be disabled, using thermometer coding, one pair will be disable in the first unit cell, another pair will be disabled in the second unit cell, and yet another pair will be disabled in the third unit cell; using binary coding, one pair will be disabled in the first unit cell and two pairs will be disabled in the second unit cell.

If four pairs of MOS devices are to be disabled, using thermometer coding, one pair will be disable in the first unit cell, another pair will be disabled in the second unit cell, yet another pair will be disabled in the third unit cell, and an additional pair will be disabled in the fourth unit cell; using binary coding, four pairs will be disabled in the fourth unit cell. And so on.

TABLE 1

| Number of Pairs to disable | Unit cell 1 | Unit cell 2 | Unit cell 3 | Unit cell 4 | |
|---|---|---|---|---|---|
| 1 | 1 | 0 | 0 | 0 | Thermometer |
|   | 1 | 0 | 0 | 0 | Binary |
| 2 | 1 | 1 | 0 | 0 | Thermometer |
|   | 0 | 2 | 0 | 0 | Binary |
| 3 | 1 | 1 | 1 | 0 | Thermometer |
|   | 1 | 2 | 0 | 0 | Binary |
| 4 | 1 | 1 | 1 | 1 | Thermometer |
|   | 0 | 0 | 4 | 0 | Binary |
| 5 | 2 | 1 | 1 | 1 | Thermometer |
|   | 1 | 0 | 4 | 0 | Binary |
| 6 | 2 | 2 | 1 | 1 | Thermometer |
|   | 0 | 2 | 4 | 0 | Binary |

Effectively, by changing the number of enabled PMOS devices or the number of enable NMOS devices in a driver, the ratio of the number of enabled PMOS devices to the number of enabled NMOS devices is modified in order to reduce the difference between the fall time and the rise time.

Figure 17:
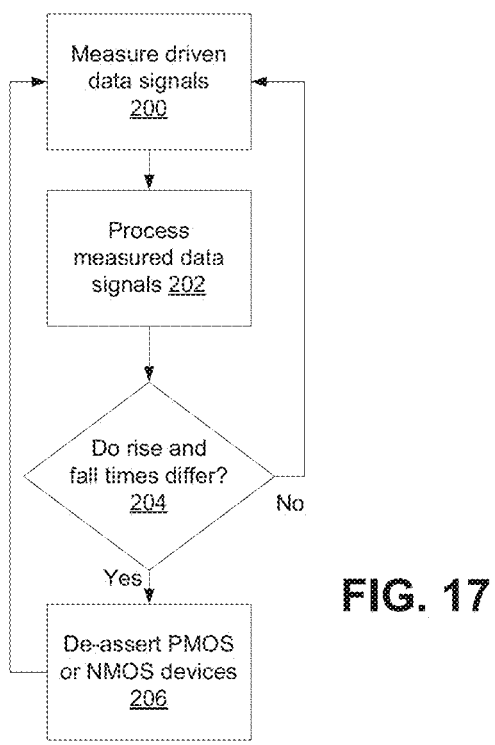
FIG. 17 shows a flowchart of a method according to certain aspects of the present disclosure.

FIG. 17 shows a flowchart of a method of adjusting the rise and fall times of a data signal, in accordance to certain embodiments of the present disclosure. Without loss of generality, the flowchart of FIG. 17 is described in relation to the voltage mode amplifier 119 of FIG. 11. At action 200, the driven data signals 112 and 114 (TXOP and TXON) are measured and are processed at action 202 to obtain a processed value. The process value is indicative of a degree of mismatch, if any, between the rise and fall time of the driven data signals 112 and 114. At action 204, in accordance with the processed value, determination is made as to whether or not there is a mismatch between the rise and fall times. If there is a mismatch between the rise and fall time, the method proceeds to action 206 where the enable ports of the PMOS and NMOS devices that are part of the amplifiers (reference numeral 100 at FIG. 10) are de-asserted or, in some embodiments, asserted. For example, if, at action 204, it is determined that the rise time is longer than the fall time, then an NMOS enable port in each of the two CMOS drivers 100 of one of the unit cells 122 can be de-asserted, which will result in increasing the fall time. Subsequently, the method proceeds to repeat actions 200-204. If, after the second iteration of action 204, the rise time is still longer than the fall time, then, at action 206, an NMOS enable port in each of the two CMOS drivers of another one of the unit cells 122 can be de-asserted, which will result in further increasing the fall time.

The calibration of the controller 118 can be performed at system startup and/or periodically in scheduled downtime intervals in what would otherwise be normal transmitter operation. Calibration may also so be performed when the transmitter becomes idle. Calibration may be performed using a transient pattern at the transmitter output, or with a static-1 or static-0 signal.

When the sensor is performing an averaging function (RC filtering), any transient pattern used must be DC-balanced (i.e. it must have an equal number of 1's and 0's over a sufficiently large window of time during which calibration is to be performed). If the pattern is not DC-balanced, the sensor can report erroneous results to the comparison block.

The use of a static-1 or static-0 signal during calibration is preferred because it will isolate differenced in $R_{PU}$ and $R_{PD}$ from any transient effects originating in the transmitter before the output driver. With a transient signal, the dynamic shape of the transmitter output waveforms will be influenced by, for example, rise/fall time mismatch or duty-cycle distortion in circuit stages preceding the output driver, and the overall calibration loop will serve to minimize the net real or apparent mismatch in $R_{PU}$ and $R_{PD}$.

Blocks such as the sensing block and the comparison block will suffer from random mismatch and operational impairments in extreme process conditions and in extreme operating temperature and supply voltage conditions which may impair their ability to function as intended.

The disclosure thus far has focused on increasing the path resistances of the composite transmitter by disabling (de-asserting) sub-cells (NMOS or PMOS devices) in one or more unit drive cells. However, it is equally possible to organize and operate the unit drive cells such that their path resistances can be decreased by enabling additional sub-cells. For example, a voltage mode transmitter with a total of N unit drive cells could have a first set of N/2 drive cells configured with all sub-cells enabled, and a second set of N/2 drive cells configured with half of all sub-cells disabled. In such a configuration, it would be possible to either increase or decrease the pull-up or pull-down path resistance of the composite transmitter by disabling sub-cells in the first set and/or enabling sub-cells in the second set. For example, if the transmitter rise time was faster than the fall time, then some PMOS sub-cells in the first set of unit cells could be disabled in conjunction with enabling some NMOS sub-cells in the second set of unit cells.

It is possible to combine the functions of rise/fall time equalization and edge rate control, given that the core actuator capabilities required for each operation are essentially the same.

To support both rise/fall time equalization and edge rated control operations simultaneously, the controller 118 and the actuator circuitries 108 and 110 simply need to be aware of each other.

For example, when rise/fall time equalization has been achieved by de-asserting certain PMOS or NMOS devices and edge rate control is desired, the actuator circuitries 108 and 110 simply needs to de-assert (disable) additional PMOS or NMOS devices on the same pull-up or pull-down path, plus an equal number of PMOS or NMOS device on the other path.

In a more general scenario where individual pull-up or pull-down path cells could be enabled or disabled to enact an actuator control adjustment (as opposed to just disabling cells), the mutual-awareness requirements of rise/fall time equalization and edge rate control do not fundamentally change.

If one disables pull-up and pull-down unit drive cell sub-cells in equal quantities, both pull-up and pull-down path resistances are increased by similar amounts. This causes the pull-up and pull-down path resistances of the composite transmitter to increase symmetrically. The result is a symmetrical slowing of transmitter output edge rates.

There are multiple advantages to using this form of edge rate control as compared to the delayed-data/blending edge rate control. The delayed-data/blending edge rate control approach is dependent on process, voltage, and operating temperature, which affects the degree of delay introduced for the purposes of blending and the range of delay for which the blending effect at the transmitter output is effective. When blending becomes ineffective, the delayed-data/blending edge rate control approach results in transmitter output waveforms that have observable and undesirable kinks, which were discussed above in relation to FIG. 4.

In contrast, the edge rate control approach of the present disclosure is fairly agnostic to the process, voltage, and operating temperature operating condition. The composite transmitter output characteristics are essentially a blending operation between unit drive cells that have no disabled sub-cells (smaller RC time constant and hence faster transitioning) and those that do have disabled sub-cells (larger RC time constant and slower transitioning). In a typical unit drive cell design, the path resistances will be designed such that the contribution of the series resistor ($R_{SER}$) dominates the path resistance versus the device portion. Thus, the dependence of the transition time adjustment range on the process voltage and temperature variations is limited to the relative contribution of the device and the series resistor. There remains process, voltage and temperature variations, but the unit drive cell can easily be designed to avoid the possibility of any kinked output waveforms. FIG. 19 shows representative edge rate control results for different PVT conditions 54 and 56, for an embodiment of the present disclosure.

Additionally, unlike the delayed-data/blending edge rate control approach which tends to result in increased data dependent jitter, the edge rate control approach of the present disclosure does not suffer impaired data-dependent jitter performance. Degradation of transmitter output transition times does generally result in somewhat impaired inter-symbol interference (ISI), but this is a characteristic of all edge rate control features.

The edge rate control approach of the present disclosure may also be used advantageously in conjunction with the delayed-data/blending edge rate control approach to modestly increase the transmitter output rise/fall time and thus increase the region of kink-free blending.

One disadvantage of the edge rate control feature of the present disclosure for a voltage mode transmitter is a reduction in transmitted output swing. This is an intrinsic characteristic of a voltage mode transmitter. Equation 6 defines the peak-to-peak output swing of a voltage-mode transmitter. This equation was first disclosed in U.S. Pat. No. 7,501,851. The final factor in the expression varies inversely with $R_{Odiff}$. Thus, an increase in $R_{Odiff}$ following the application of the edge rate control feature of the present disclosure will result in a reduction in output swing. This reduction is fairly modest, however, and is not considered a significant impairment for most applications. In a representative embodiment of the present disclosure, the output impedance may be increased by approximately 20% through application of the edge rate control feature of the present disclosure. This increase, in a 100-Ohm load ($R_L$=100 Ohm) and 67 Ohm nominal output impedance ($R_{Odiff}$=67 Ohm) environment results in an output amplitude degradation of approximately 7.5%.

$$V_{Odiff(pk-pk)} = 2 \cdot VDD \cdot \frac{D}{D+PT} \cdot \frac{R_L}{R_L + R_{Odiff}} \quad \text{Equation 6}$$

The characteristic of reduced output swing that accompanies increasing amounts of edge rate control as per the present disclosure is shown in FIG. 18.

As described above, the control signal modifications to the actuator circuitries initiated by the controller served to disable CMOS inverter-like driver components for the purposes of increasing the smaller of the path resistances $R_{PU}$ or $R_{PD}$ to more closely match the larger one. It would be equally possible to reconfigure the actuator circuitries such that the larger path resistance was reduced to more closely match the smaller one by enabling additional CMOS inverter-like driver components. It would also be possible to simultaneously enable some CMOS inverter-like driver components and disable others for the purposes of increasing one of $R_{PU}$ or $R_{PD}$ and decreasing the other to make them more closely match each other.

Achieving edge-rate control was described as an operation of disabling CMOS inverter-like driver components to achieve a simultaneous increase in both $R_{PU}$ and $R_{PD}$ to achieve slower edge rates (e.g., to reduce electromagnetic interference). It would be equally possible to permit an operation of enabling additional CMOS inverter-like driver components to achieve a simultaneous decrease in both $R_{PU}$ and $R_{PD}$ to achieve faster edge rates.

By targeting the equalization of rise and fall times for transmitter outputs, it is possible to improve the signal integrity performance of high-speed serial link applications and also to possibly reduce the EMI generated by a transmitter.

The present disclosure provides an edge-rate control feature that can be used at high data rates and without impairment in data-dependent jitter performance and without "kinks" in the transmitted waveforms.

In the preceding description, for purposes of explanation, numerous details are set forth in order to provide a thorough understanding of the embodiments of the disclosure. However, it will be apparent to one skilled in the art that these specific details are not required in order to practice the disclosure. In other instances, well-known electrical structures and circuits are shown in block diagram form in order not to obscure the disclosure. For example, specific details are not provided as to whether the embodiments of the disclosure described herein are implemented as a software routine, hardware circuit, firmware, or a combination thereof.

Embodiments of the disclosure can be represented as a software product stored in a machine-readable medium (also referred to as a computer-readable medium, a processor-readable medium, or a computer usable medium having a computer-readable program code embodied therein). The machine-readable medium can be any suitable tangible medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described disclosure can also be stored on the machine-readable medium. Software running from the machine-readable medium can interface with circuitry to perform the described tasks.

The above-described embodiments of the disclosure are intended to be examples only. Alterations, modifications and variations can be effected to the particular embodiments by those of skill in the art without departing from the scope of the disclosure, which is defined solely by the claims appended hereto.

What is claimed is:

1. A method of adjusting the rise time and fall time of output signals generated by a voltage-mode differential transmitter (VMT), the method comprising:
   a) receiving at least one of a first output signal generated by a first driver of the VMT and a second output signal generated by a second driver of the VMT to obtain at least one received signal, the first driver including first inverter elements electrically connected to each other in parallel, the second driver including second inverter elements electrically connected to each other in parallel, each first inverter element and each second inverter element having a PMOS device and an NMOS device, the first output signal and the second output signal having a rise time and a fall time;
   b) processing the at least one received signal to determine if there is difference between the fall time and the rise time; and
   c) responsive to determining that there is a difference between the fall time and the rise time, modifying, in each of the first driver and the second driver, a ratio of a number of enabled PMOS devices to a number of enabled NMOS devices to reduce the difference between the fall time and the rise time.

2. The method of claim 1 wherein:
   processing includes:
      generating an indicator value indicative of one of the rise time being greater than the fall time and the rise time being smaller than the fall time; and
      adding the indicator value to a counter;
   and,
   modifying the ratio of the number of enabled PMOS devices to the number of enabled NMOS devices is effected responsive to a counter value of the counter being outside a pre-determined counter value range.

3. The method of claim 2 wherein modifying the ratio of the number of enabled PMOS devices to the number of enabled NMOS devices is preceded by:
  determining the counter value; and
  responsive to the counter value being inside the pre-determined range, repeating actions a) and b).

4. The method of claim 1 wherein in each of the first driver and the second driver, the ratio of the number of enabled PMOS devices to the number of enabled NMOS devices is the same.

5. The method of claim 4 wherein the rise time is greater than the fall time and modifying, in each of the first driver and the second driver, the ratio of the number of enabled PMOS devices to the number of enabled NMOS devices includes decreasing the ratio.

6. The method of claim 4 wherein the rise time is smaller than the fall time and modifying, in each of the first driver and the second driver, the ratio of the number of enabled PMOS devices to the number of enabled NMOS devices includes increasing the ratio.

7. The method of claim 1 wherein receiving at least one of the first output signal and the second output signal consists in receiving only one of the first output signal and the second output signal.

8. The method of claim 1 wherein receiving at least one of the first output signal and the second output signal consists in receiving the first output signal and the second output signal.

9. The method of claim 1 wherein processing the at least one received signal includes comparing the at least one received signal to a reference signal.

10. The method of claim 9 wherein comparing the at least one received signal to a reference signal includes filtering the at least one received signal and the reference signal.

11. A method of adjusting the rise time and fall time of output signals generated by a composite voltage-mode differential transmitter (CVMT), the method comprising:
  a) receiving at least one of a first output signal generated by a first set of drivers of the CVMT and a second output signal generated by a second set of drivers of the CVMT to obtain at least one received signal, the CVMT comprising unit cells, each unit cell having a driver of the first set of drivers and a driver of the second set of drivers, each driver of the first set of drivers including first inverter elements electrically connected to each other in parallel, each driver of the second set of drivers including second inverter elements electrically connected to each other in parallel, each first inverter element and each second inverter element having a PMOS device and an NMOS device, the first output signal and the second output signal having a rise time and a fall time;
  b) processing the at least one received signal to determine if there is difference between the fall time and the rise time; and
  c) responsive to determining that there is a difference between the fall time and the rise time, modifying, in each of the first driver and the second driver of at least one unit cell, a ratio of a number of enabled PMOS devices to a number of enabled NMOS devices to reduce the difference between the fall time and the rise time.

12. A method of controlling an edge rate of output signals generated by a composite voltage-mode differential transmitter (CVMT), the method comprising:
  a) determining an initial edge rate of a first output signal and a second output signal, the first output signal generated by a first set of drivers of the CVMT and the second output signal generated by a second set of drivers of the CVMT, the CVMT comprising unit cells, each unit cell having a driver of the first set of drivers and a driver of the second set of drivers, each driver of the first set of drivers including first inverter elements electrically connected to each other in parallel, each driver of the second set of drivers including second inverter elements electrically connected to each other in parallel, each first inverter element and each second inverter element having a PMOS device and an NMOS device, the first output signal and the second output signal having a rise time and a fall time; and
  b) in accordance with the initial edge rate and, in accordance with a target edge rate, modifying, in each of the first driver and the second driver of at least one unit cell, a ratio of a number of enabled PMOS devices to a number of enabled NMOS devices to modify the edge rate of the first output signal and the second output signal.

13. A voltage mode transmitter comprising:
  a) first drivers and second drivers, the first drivers electrically connected to each other in parallel, the second drivers electrically connected to each other in parallel, each first driver including first inverter elements electrically connected to each other in parallel, each second driver including second inverter elements electrically connected to each other in parallel, each first inverter element and each second inverter element having a PMOS device and an NMOS device;
  b) sensor circuitry arranged to receive at least one of a first output signal produced by the first drivers and a second output signal produced by the second drivers, the first output signal and the second output signal having a rise time and a fall time, the sensor circuitry to determine, as function of the at least one of the first output signal and the second output signal, a difference between the rise time and the fall time, the sensor circuitry to generate a sensor circuitry output signal indicative of the difference between the rise and fall time;
  c) controller circuitry arranged to receive the sensor circuitry output signal and to generate a control signal as a function of the sensor circuitry output signal; and
  d) actuator circuitry arranged to receive the control signal, the actuator circuitry operationally coupled to the first drivers and to the second drivers, the actuator circuitry configured to enable or disable PMOS devices and to enable or disable NMOS devices in each of the first drivers and in each of the second drivers, as a function of the control signal, to reduce the difference between the fall time and the rise time.

14. The voltage mode transmitter of claim 13 wherein the sensor circuitry includes:
  filter circuitry to filter the at least one of the first output signal and the second output signal to obtain a filtered transmitter signal, the filter circuitry also to filter a reference signal to obtain a filtered reference signal; and
  comparator circuitry to receive the filtered transmitter signal and the filtered reference signal, the comparator to generate the sensor circuitry output signal as a function of the filtered transmitter signal and of the filtered reference signal.

15. The voltage mode transmitter of claim 14 wherein the sensor circuitry includes transmission gate circuitry to receive the first output signal and the second output signal, the transmission gate circuitry to provide the first output signal, the second output signal, or both the first output signal and the second output signal to the filter circuitry.

16. A voltage mode transmitter comprising:
a) first drivers and second drivers, the first drivers electrically connected to each other in parallel, the second drivers electrically connected to each other in parallel, each first driver including first inverter elements electrically connected to each other in parallel, each second driver including second inverter elements electrically connected to each other in parallel, each first inverter element and each second inverter element having a PMOS device and an NMOS device, the first drivers to produce a first output signal, the second drivers to produce a second output signal, the first output signal and the second output signal each having an edge rate; and
b) actuator circuitry arranged to receive an edge rate control signal, the actuator circuitry operationally coupled to the first drivers and to the second drivers, the actuator circuitry configured to enable or disable PMOS devices and to enable or disable NMOS devices in each of the first drivers and in each of the second drivers, as a function of the edge rate control signal, to control the edge rate of the first output signal and of the second output signal.

* * * * *